US012666958B2

(12) United States Patent
Li et al.

(10) Patent No.:   US 12,666,958 B2
(45) Date of Patent:       Jun. 23, 2026

(54) FLEXIBLE WIRING ARCHITECTURE FOR MULTI-DIE INTEGRATION

(71) Applicant: International Business Machines Corporation, Armonk, NY (US)

(72) Inventors: Tao Li, Slingerlands, NY (US); Ruilong Xie, Niskayuna, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 17/948,664

(22) Filed: Sep. 20, 2022

(65) Prior Publication Data

US 2024/0096783 A1      Mar. 21, 2024

(51) Int. Cl.
| | |
|---|---|
| *H10W 20/40* | (2026.01) |
| *H10W 20/41* | (2026.01) |
| *H10W 20/42* | (2026.01) |
| *H10W 20/44* | (2026.01) |
| *H10W 72/90* | (2026.01) |
| *H10W 80/00* | (2026.01) |
| *H10W 90/00* | (2026.01) |

(52) U.S. Cl.
CPC ......... *H10W 20/496* (2026.01); *H10W 20/42* (2026.01); *H10W 20/427* (2026.01); *H10W 20/435* (2026.01); *H10W 80/327* (2026.01); *H10W 90/00* (2026.01); *H10W 20/4421* (2026.01); *H10W 72/952* (2026.01); *H10W 80/312* (2026.01); *H10W 90/792* (2026.01)

(58) Field of Classification Search
CPC ............. H01L 23/5223; H01L 23/5286; H01L 25/0652; H01L 2924/30105; H01L 25/18; H01L 25/0657
See application file for complete search history.

(56) References Cited

U.S. PATENT DOCUMENTS

| | | | |
|---|---|---|---|
| 8,716,898 B1 * | 5/2014 | Liu | ..................... H01L 23/5223 |
| | | | 307/102 |
| 9,331,062 B1 | 5/2016 | Lane et al. | |
| 9,870,982 B2 | 1/2018 | Secker et al. | |
| 10,177,031 B2 | 1/2019 | Bao et al. | |
| 10,475,735 B2 | 11/2019 | Suo et al. | |
| 11,270,917 B2 | 3/2022 | Han | |
| 11,309,246 B2 | 4/2022 | Dabral et al. | |
| 2017/0012029 A1 | 1/2017 | Lambert et al. | |

(Continued)

FOREIGN PATENT DOCUMENTS

CN            113540059 A  * 10/2021  ............. H01L 24/06

OTHER PUBLICATIONS

W. S. Liao et al., "A Manufacturable Interposer MIM Decoupling Capacitor with Robust Thin High-K Dielectric for Heterogeneous 3D IC CoWoS Wafer Level System Integration," International Electron Devices Meeting, Dec. 2014, pp. 27.3.1-27.3.4.

(Continued)

*Primary Examiner* — Mamadou L Diallo
(74) *Attorney, Agent, or Firm* — L. Jeffrey Kelly; Ryan, Mason & Lewis, LLP

(57)                 ABSTRACT
A semiconductor structure includes a power distribution structure disposed on a first wafer, an interconnect structure disposed on the first wafer and a second wafer, and at least one decoupling capacitor connected between the power distribution structure and the interconnect structure.

20 Claims, 15 Drawing Sheets

(56) References Cited

U.S. PATENT DOCUMENTS

| | | | |
|---|---|---|---|
| 2021/0273042 A1* | 9/2021 | Kim | H01L 23/49816 |
| 2021/0343650 A1 | 11/2021 | Peng et al. | |
| 2022/0102277 A1* | 3/2022 | Chanemougame | H01L 21/4885 |
| 2022/0165721 A1* | 5/2022 | Lee | H01L 24/16 |
| 2025/0266415 A1* | 8/2025 | Lee | H10D 86/85 |

OTHER PUBLICATIONS

H. Lin et al., "84%-Efficiency Fully Integrated Voltage Regulator for Computing Systems Enabled by 2.5-D High-Density MIM Capacitor," IEEE Transactions on Very Large Scale Integration (VLSI) Systems, May 2022, pp. 661-665, vol. 30, No. 5.

\* cited by examiner

FLEXIBLE WIRING ARCHITECTURE FOR MULTI-DIE INTEGRATION

BACKGROUND

Innovations in semiconductor fabrication and packaging technologies have enabled the development of smaller scale, higher density integrated circuits (IC) on separate wafers as well as the development of highly integrated chips or devices with wiring for power and signal distribution between the devices of the wafers. These ICs may be arranged in stacked relation and usually incorporate decoupling capacitors to stabilize power supply voltages, i.e., minimize or eliminate power jitter. Indeed, high performance ICs require high capacitance, high quality and low-impedance decoupling capacitors to reduce noise and increase performance amongst the stacked wafers and dies. However, introducing decoupling capacitors provides substantial challenges during manufacture.

SUMMARY

In an illustrative embodiment, a semiconductor structure comprises a power distribution structure disposed on a first wafer, an interconnect structure disposed on the first wafer and a second wafer, and at least one decoupling capacitor connected between the power distribution structure and the interconnect structure.

In accordance with another illustrative embodiment, a semiconductor structure comprises a first wafer comprising a first device and a first back end of line structure, a second wafer comprising a second device and a second back end of line structure, the second back end of line structure of the second wafer being coupled to the first back end of line structure of the first wafer, one or more power lines at least partially extending within the first wafer and the second wafer, a power distribution structure, and a decoupling capacitor disposed within the power distribution structure. The decoupling capacitor couples the one or more power lines with the first device of the first wafer and the second device of the second wafer.

In accordance with yet another illustrative embodiment, a semiconductor structure comprises a first wafer comprising a first die with a logic device and a first back end of line structure, a second wafer comprising a plurality of second dies where each second die has a memory device and a second back end of line structure. The second wafer and the first wafer are coupled to each other through bonding of one or more power lines and one or more signal lines of the first and second back end of line structures. A power distribution structure is disposed on the first wafer. The power distribution structure comprises at least one decoupling capacitor coupled to the logic device of the first wafer and at least two of the memory devices of the second wafer.

DETAILED DESCRIPTION

Figure 1A:
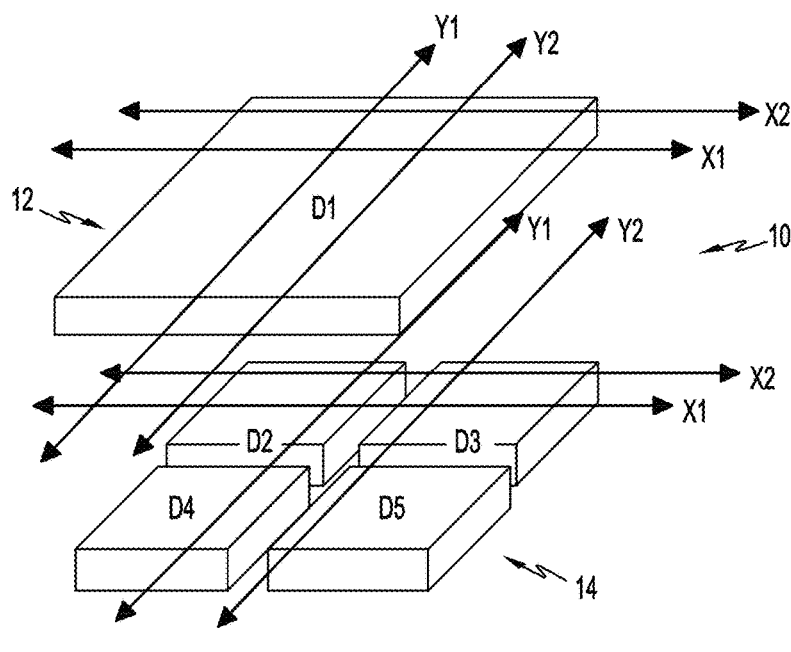
FIG. 1A is a schematic perspective view of first and second wafers of a semiconductor structure according to one or more illustrative embodiments.

Illustrative embodiments of the disclosure will now be described with regard to methods for fabricating semiconductor structures, as well as semiconductor devices comprising multi-chip integrated circuit (IC) dies and associated package structures. Embodiments of the disclosure will now be discussed in further detail with regard to multi-chip package structures having decoupling capacitors, for example, metal-insulator-metal (MIM) capacitors which are shared by multiple wafers to provide power in parallel to respective dies on the wafers.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure is not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and IC fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including the packaged integrated circuit according to illustrative embodiments utilize a variety of individually known physical and chemical processes performed on a semiconductor (e.g., silicon) substrate, some of which are described in the immediately following paragraphs.

In the discussion that follows, the semiconductor structure, which will incorporate one or more integrated circuit devices, will be referred to as the "semiconductor structure 10" throughout the various intermediate stages of fabrication, as represented in all the accompanying drawings.

Figures 1B, 1C:
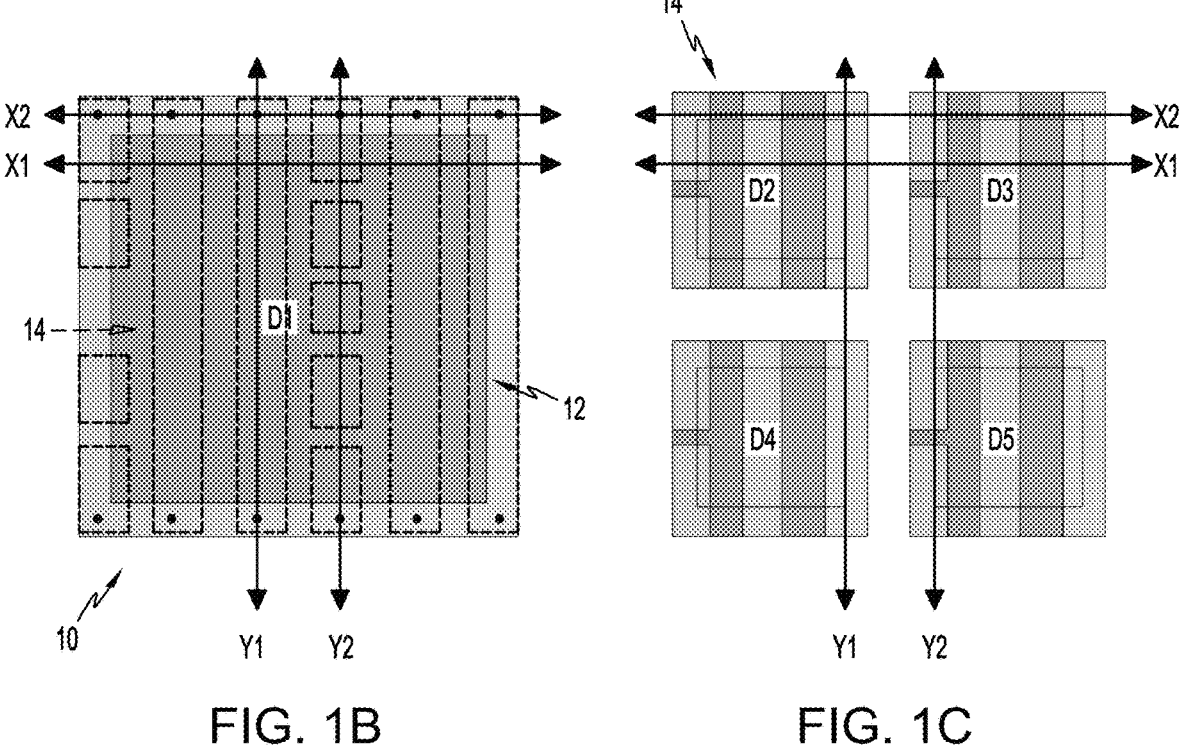
FIG. 1B is a schematic top plan view of the first wafer including a single die according to one or more illustrative embodiments.
FIG. 1C is a schematic top plan view of the second wafer including multiple dies according to one or more illustrative embodiments.

FIGS. 1A-1C schematically illustrate a semiconductor structure 10 including first and second semiconductor wafers 12, 14 which are to be coupled or bonded to each other to form at least a component of an integrated circuit package. The first wafer 12, hereinafter referred to as a "first logic wafer," includes, for example, a single die having device "D1" and the second wafer 14, hereinafter referred to as a "second carrier wafer," includes multiple dies, which, in illustrative embodiments, includes devices D2, D3, D4, D5. The dies are segments of the wafers 12, 14 each including one or more integrated devices D1-D5. In other illustrative embodiments, the carrier wafer 14 may include a single die. The semiconductor structure defines axes X1, X2, Y1, Y2 which respectively extend along the width and depth of the first logic wafer 12 and the second carrier wafer, 14. The various cross-sectional views of the semiconductor structure 10 in the following drawings are taken along these respective axes.

Figures 2, 3:
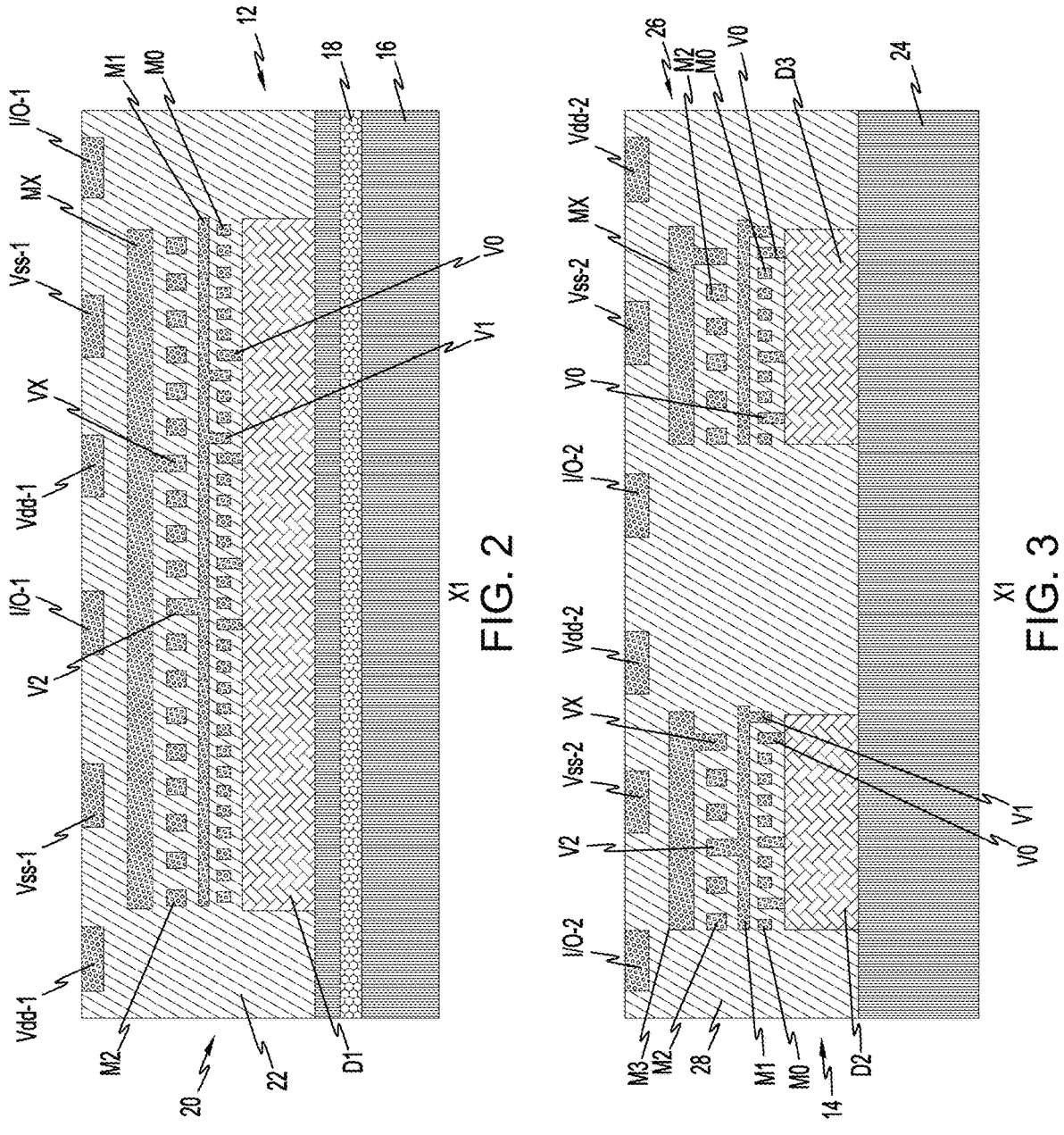
FIG. 2 is a side elevation view in cross-section of the first wafer taken along the line X1 of FIGS. 1A-1C at a first intermediate stage of fabrication according to one or more illustrative embodiments.
FIG. 3 is a side elevation view in cross-section of the second wafer taken along the line X1 of FIGS. 1A-1C at the first intermediate stage of fabrication according to one or more illustrative embodiments.

FIGS. 2 and 3 illustrate a first intermediate stage of fabrication of the semiconductor structure 10. With reference to FIG. 2, which is a cross-sectional view taken along the line X1 of the semiconductor structure 10, the logic wafer 12 includes a first wafer substrate 16, an etch stop layer 18 disposed in the first wafer substrate 16, the single die having device D1 and an interconnect structure 20. The first wafer substrate 16 may comprise any suitable semiconductor package substrate. In illustrative embodiments, the first wafer substrate 16 may be formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g., III-V and II-VI). The etch stop layer 18 is embedded in the first wafer substrate 16 and may comprise silicon dioxide ($SiO_2$) or silicon germanium (SiGe). The device D1 includes one or more integrated circuits and devices, or portions thereof, configured to support different computing functions. For example, and without limitation, the single die having device D1 may be a modular logic unit having a plurality of interconnected IC devices for performing various computing functions. In various embodiments, the one or more IC devices include one or a combination of a logic, signal, or application processor, a memory, a high-bandwidth memory (HBM), a system on an IC (SoIC), a transmitter and/or receiver, an application-specific IC (ASIC), a large-scale integration (LSI) or very large-scale integration (VLSI) circuit, a voltage or current regulator, or the like. In other illustrative embodiments, the device D1 may include a memory unit.

The interconnect structure 20 may be formed using state-of-the-art back end of line (BEOL) processing techniques. The interconnect structure 20 includes dielectric layer 22, which may comprise multiple inter-level dielectric (ILD) layers, and BEOL metallization levels (e.g., copper metallization) that are deposited and patterned to form the various metallization layers M0, M1, M2 to MX and vias V0, V1, V2 to VX embedded within the ILD layers of the dielectric layer 22. The ILD layers of the dielectric layer 22 can be formed using dielectric materials which are commonly used for BEOL fabrication, including, but not limited to, silicon oxide (SiO), hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). As part of the wafer frontside BEOL process, top level metal layers may be formed including one or more positive voltage (Vdd-1) contacts or lines and one or more ground voltage (Vss-1) contacts or lines, e.g., two sets of positive voltage (Vdd-1) contacts or lines and two sets of ground voltage (Vss-1) contacts or lines. The (Vdd-1) contacts or lines and the (Vss-1) contacts or lines are also referred to as power lines of the logic wafer 12. In addition, one or more signal input-output (I/O-1) contacts or lines, for example, two signal I/O-1 contacts or lines (also referred to as signal lines) of the logic wafer 12 also may be formed in the substrate in association with the frontside BEOL process.

With reference to FIG. 3, which is a cross-sectional view taken along the line X1 of the carrier wafer 14, the carrier wafer 14 includes a second wafer substrate 24, the multiple dies having devices D2-D5 and a BEOL interconnect structure 26. In illustrative embodiments, the second substrate 24 may comprise silicon. The multiple devices D2-D5 in some illustrative embodiments include memory devices such as one or more sets of DRAM array cells corresponding to a certain storage size. In other illustrative embodiments, the devices D2-D5 may include logic devices, or any combination of one or more memory devices, one or more logic devices and one or more other devices. The interconnect structure 26 includes dielectric layer 28 and various metallization layers M0, M1, M2 to MX and vias V0, V1, V2 to VX formed, for example, using state-of-the-art BEOL processing techniques. As part of the BEOL process, top-level metal layers having sets of positive voltage (Vdd-2) contacts and ground voltage (Vss-2) contacts (also referred to as power lines of the carrier wafer), and at least one signal I/O contact, for example, two signal (I/O-1, I/O-2) contacts (also referred to as signal lines of the carrier wafer 14) are formed in the dielectric layer 28.

Figure 4:
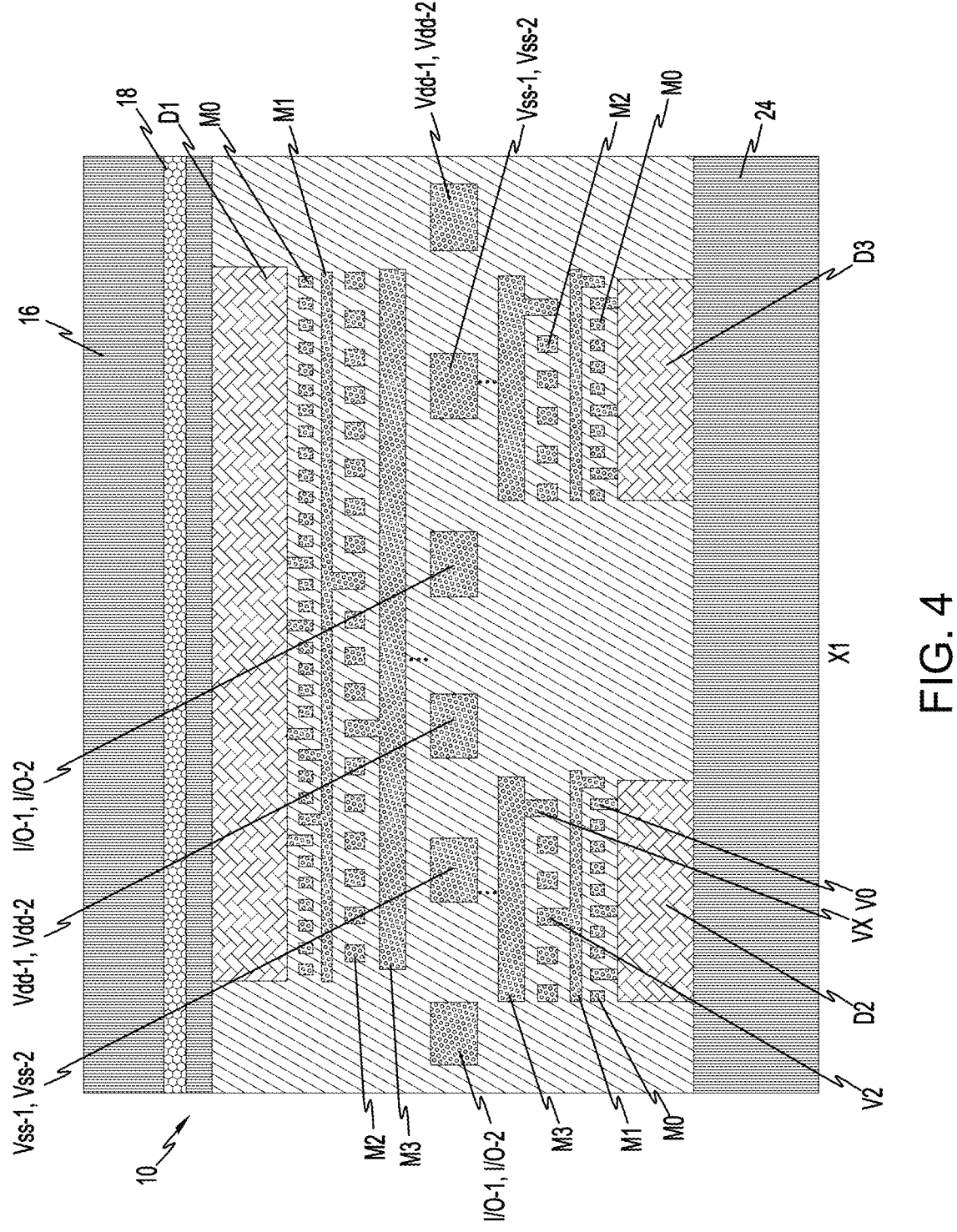
FIGS. 4-7 each are side elevation views in cross-section of the first and second wafers taken along the lines X1, X2, Y1 and Y2, respectively, of FIGS. 1A-1C at a second intermediate stage of fabrication according to one or more illustrative embodiments.

Referring now to FIG. 4 illustrating a second intermediate stage of fabrication, the logic wafer 12 is "flipped" and bonded to the carrier wafer 14. In illustrative embodiments, a copper-to-copper bonding methodology is utilized in which the positive voltage contacts (Vdd-1, Vdd-2), ground voltage contacts (Vss-1, Vss-2) and signal contacts (I/O-1, I/O-2) respectively of the logic wafer 12 and carrier wafer 14 are bonded to each other. FIG. 4 is a cross-sectional view of the semiconductor structure 10 taken along the line X1. Any suitable copper-to-copper bonding methodology may be utilized. Other bonding methods include thermos-compression bonding (diffusion bonding), Cu—Cu bonding with passivation capping layers bonding processes, surface activated bonding (SAB), and alternative bonding methods (Cu/dielectric hybrid and Cu—Cu insertion bonding). Subsequent to the bonding processes, the positive voltage (Vdd-1, Vdd-2) contacts, the ground voltage (Vss-1, Vss-2) contacts and the signal (I/O-1, I/O-2) contacts of the respective first and second devices D1, D2-5 are aligned and in contacting bonded relation.

Figure 5:
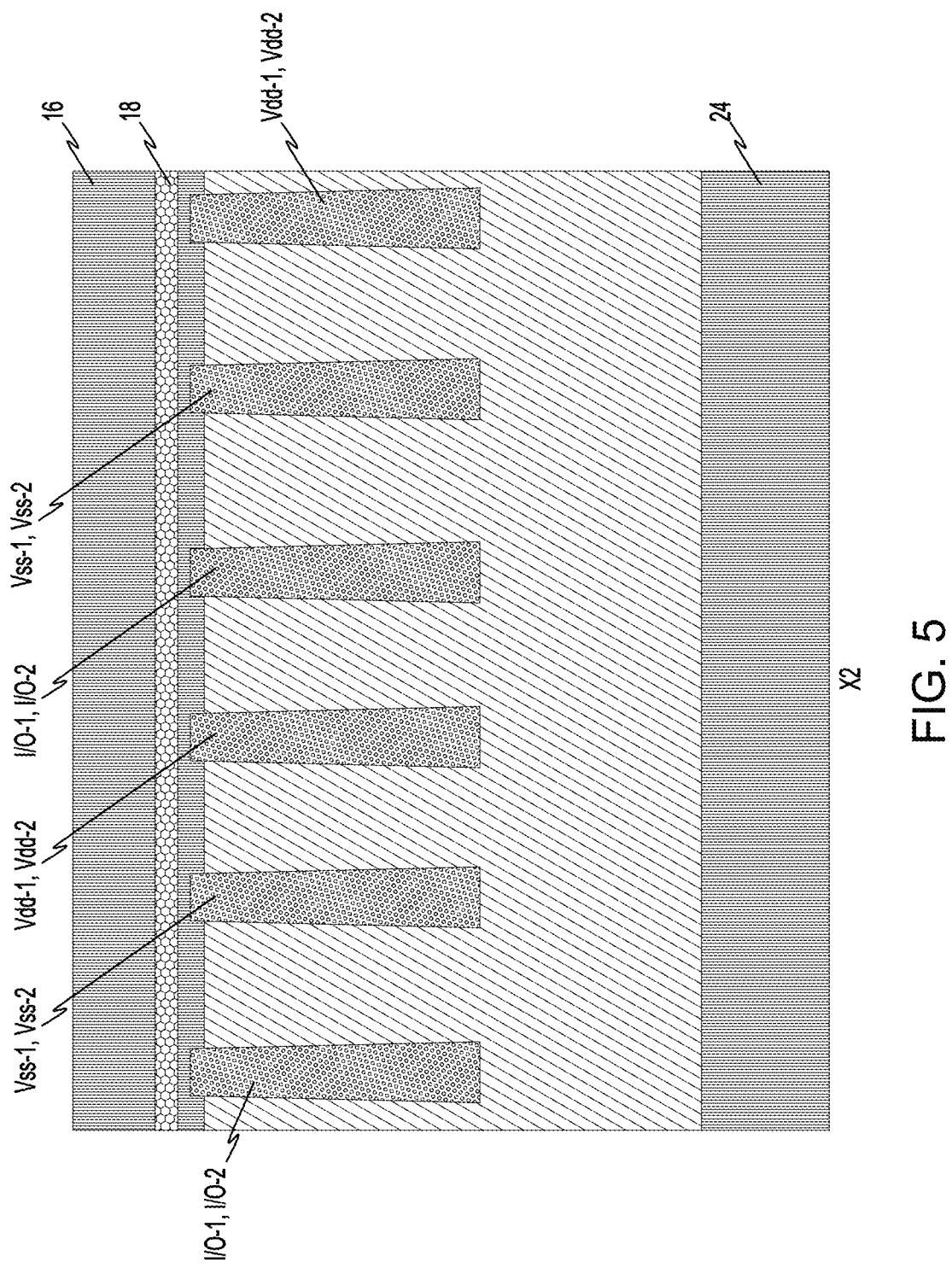

FIG. 5 is a cross-sectional view of the semiconductor structure 10 taken along the line X2 at the second intermediate stage of fabrication and at the periphery of the semiconductor structure 10. As depicted, the power lines including portions of the positive voltage (Vdd-1) lines and the ground voltage (Vss-1) lines and portions of the signal lines including the signal (I/O-1) lines of the logic wafer 12 extend along the height of the logic wafer 12 into the etch stop layer 18. FIG. 5 further illustrates the combined power (Vdd-1, Vdd-2), (Vss-1, Vss-2) lines or contacts and the combined signal (I/O-1, I/O-2) lines or contacts.

Figure 6:
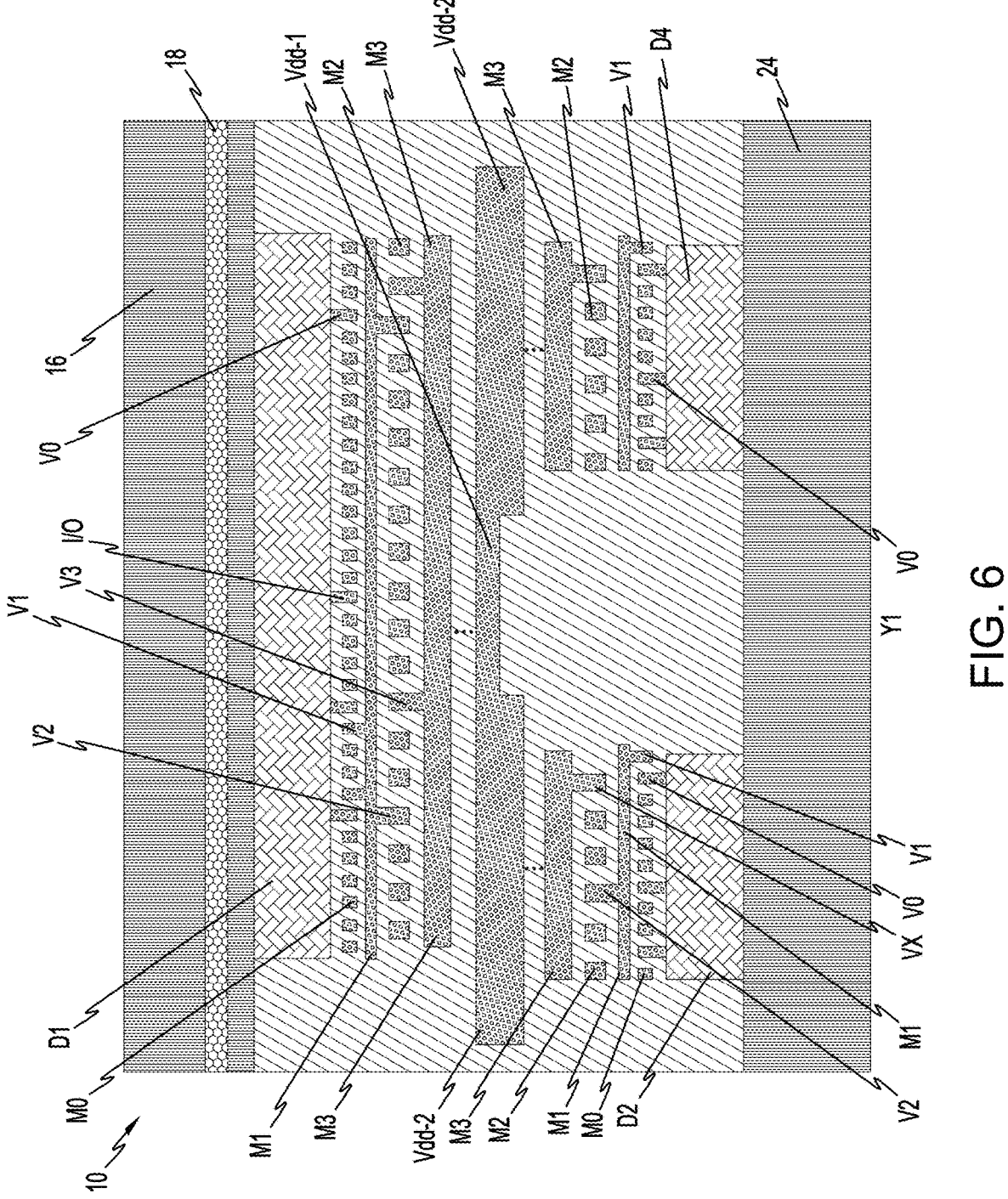

FIG. 6 is a cross-sectional view of the semiconductor structure 10 taken along the line Y1 at the second intermediate stage of fabrication. The positive voltage (Vdd-1) lines or contacts of the first device D1 of the logic wafer 12 are coupled or bonded to the positive voltage (Vdd-2) lines or contacts of the second and fourth devices D2, D4 of the carrier wafer 14 to transfer power between the devices D1, D2, D4. A corresponding cross-section along a corresponding cross-sectional line would show the connection of the one or more ground voltage (Vss-1, Vss-2) lines between devices D1 of the logic wafer 12 and the devices D3, D5 of the carrier wafer 14.

Figure 7:
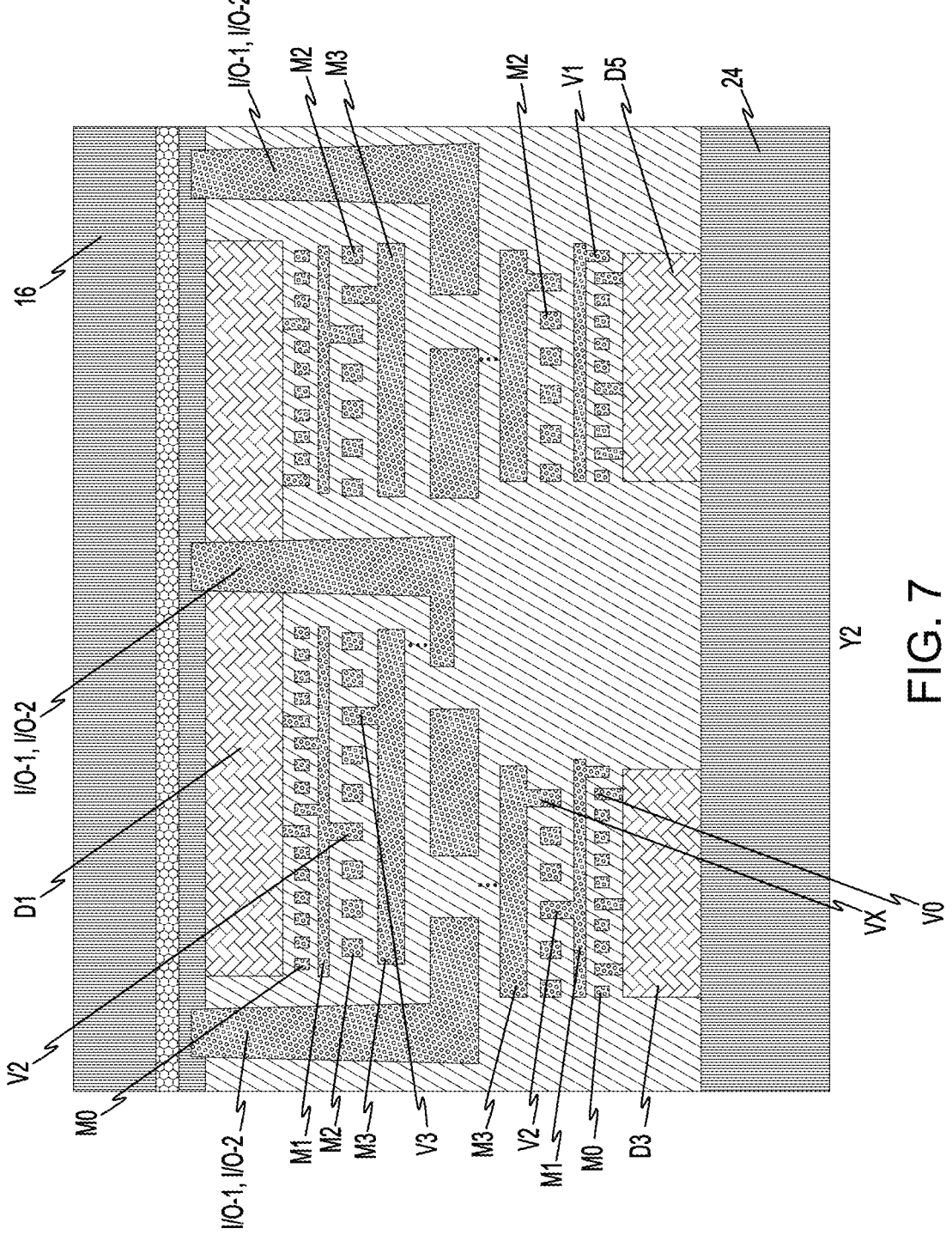
Figure 8:
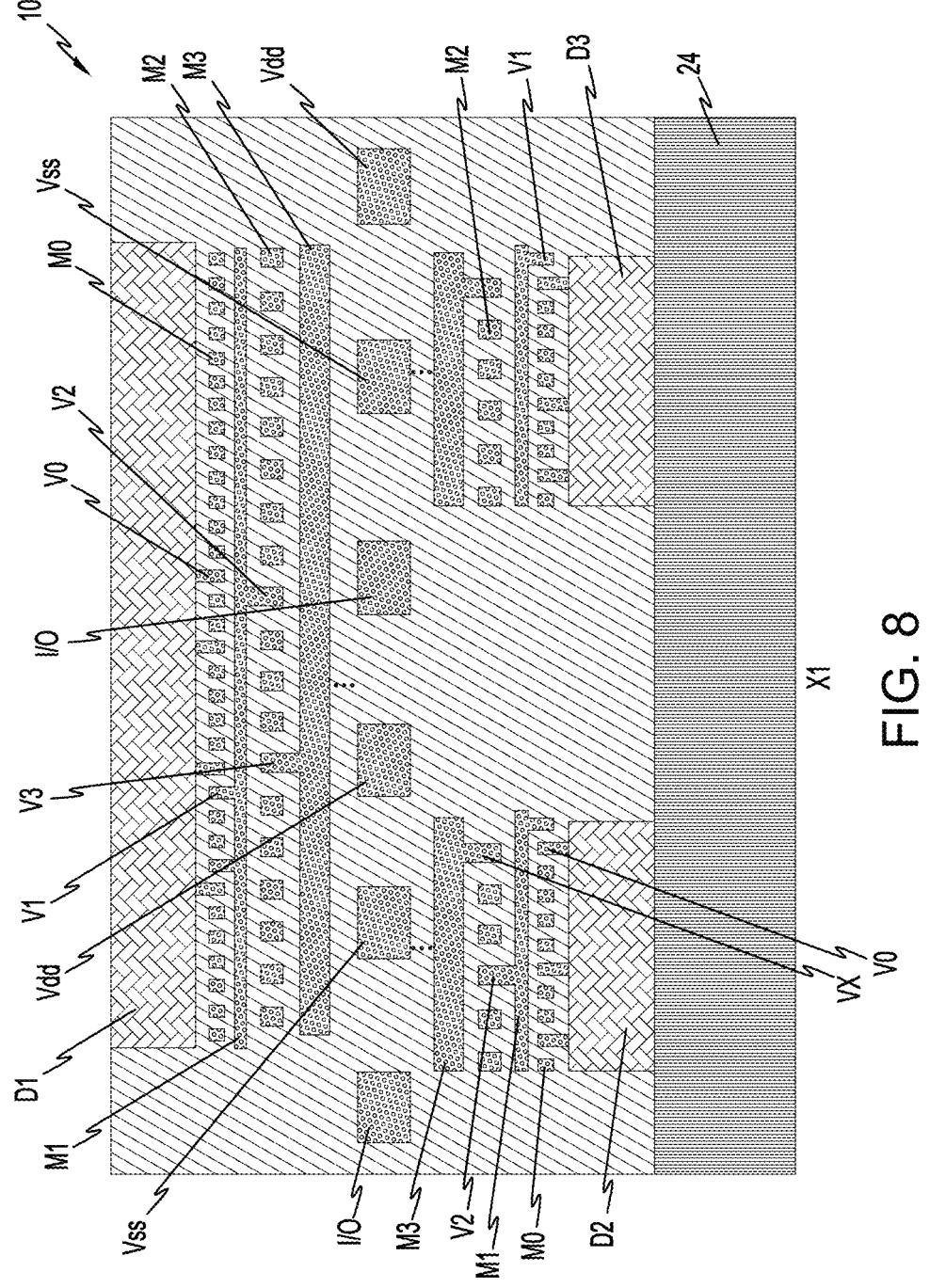
FIGS. 8-11 each are side elevation views in cross-section of the first and second wafers taken along the lines X1, X2, Y1 and Y2, respectively, of FIGS. 1A-1C at a third intermediate stage of fabrication according to one or more illustrative embodiments.

FIG. 7 is a cross-sectional view of the semiconductor structure 10 along the line Y2 at the second intermediate stage of fabrication to illustrate connection of the signal I/O-2 lines or contacts of the of the carrier wafer 14 with the signal I/O-1 lines or contacts of the logic wafer 12 thereby forming continuous I/O-1, I/O-2 lines as shown. The central I/O-1, I/O-2 line or contact directly connects solely to the first device D1 of the logic wafer 12, and, in illustrative embodiments extend through the first device D1.

Figure 9:
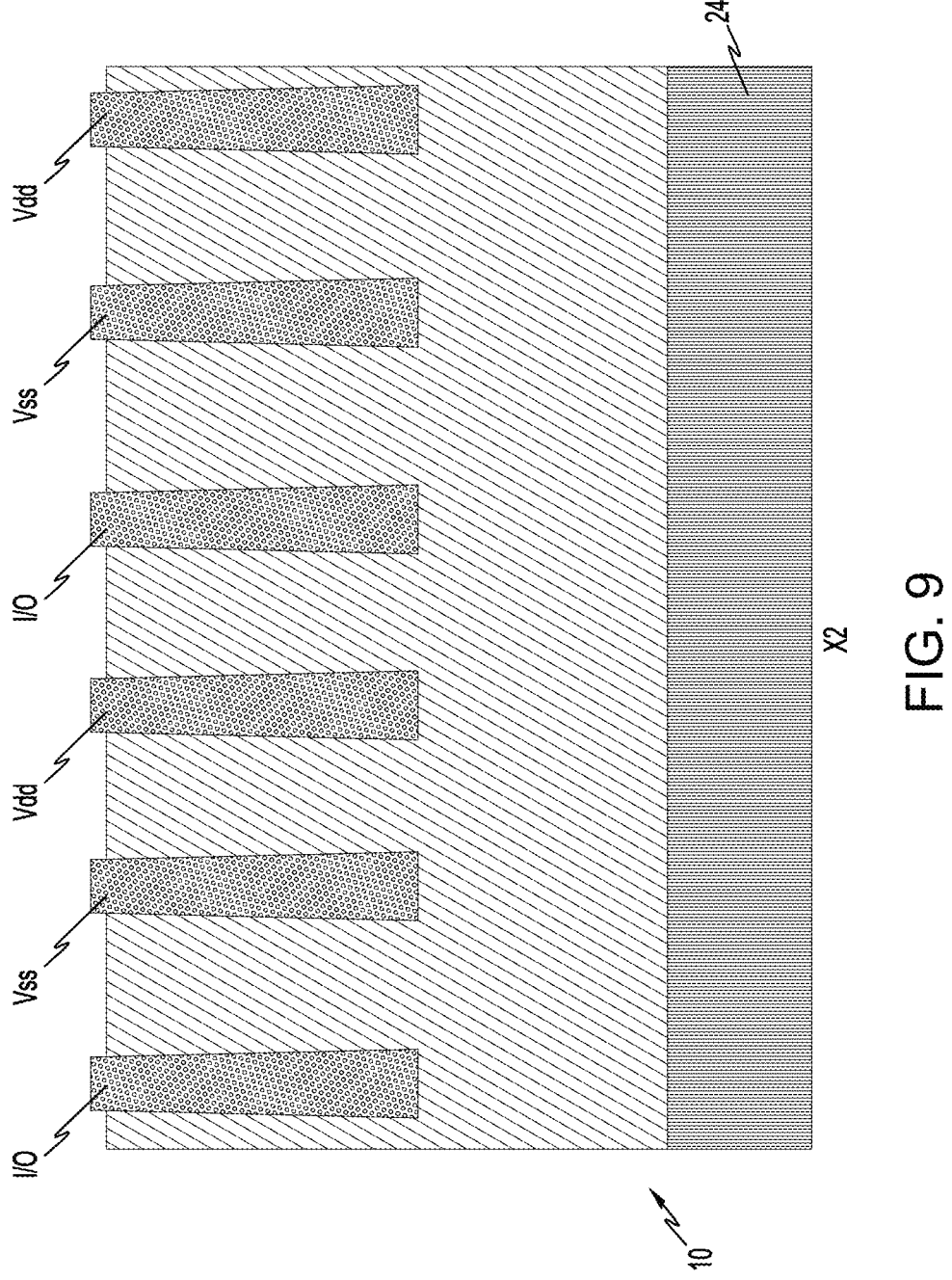
Figure 10:
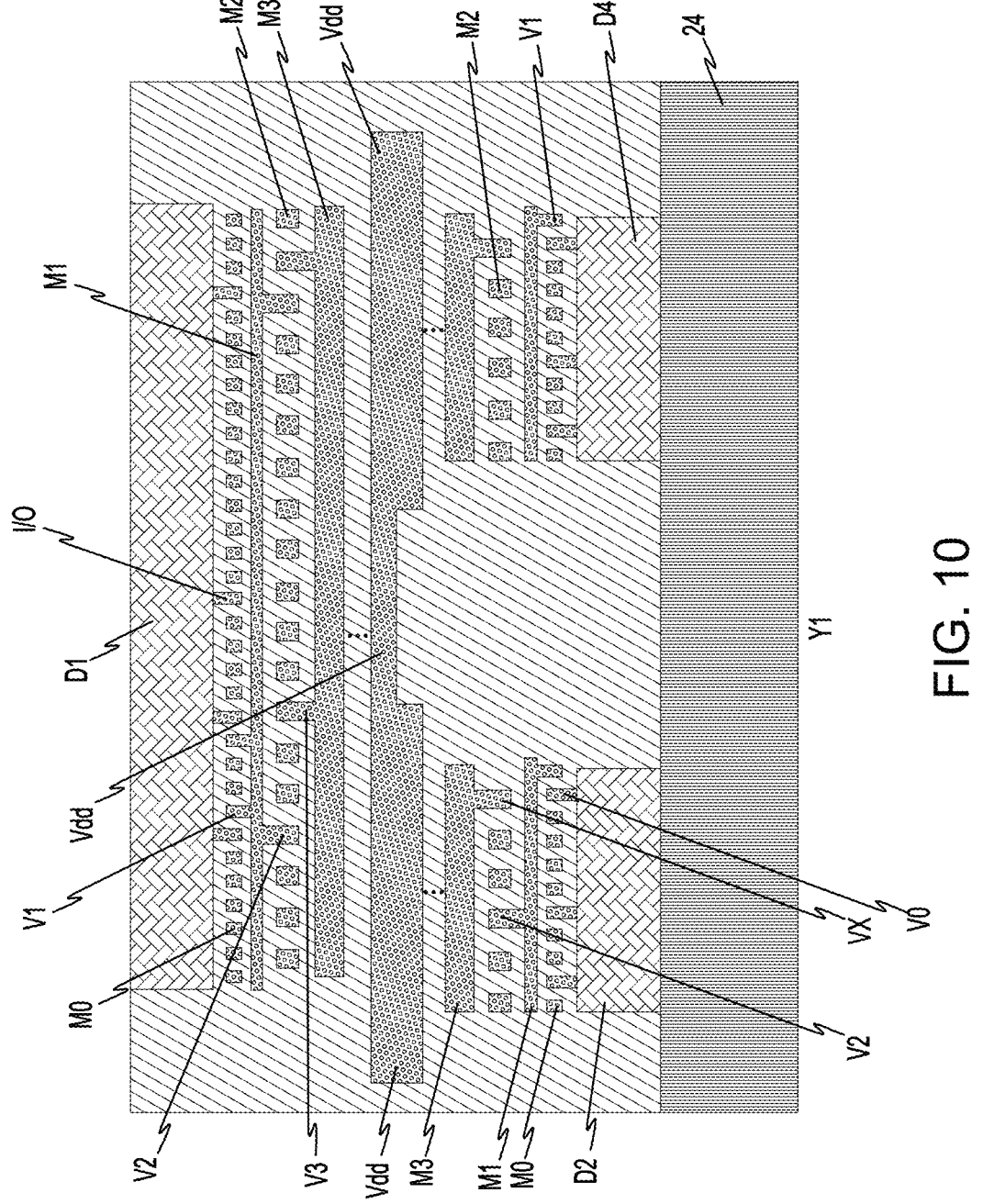
Figure 11:
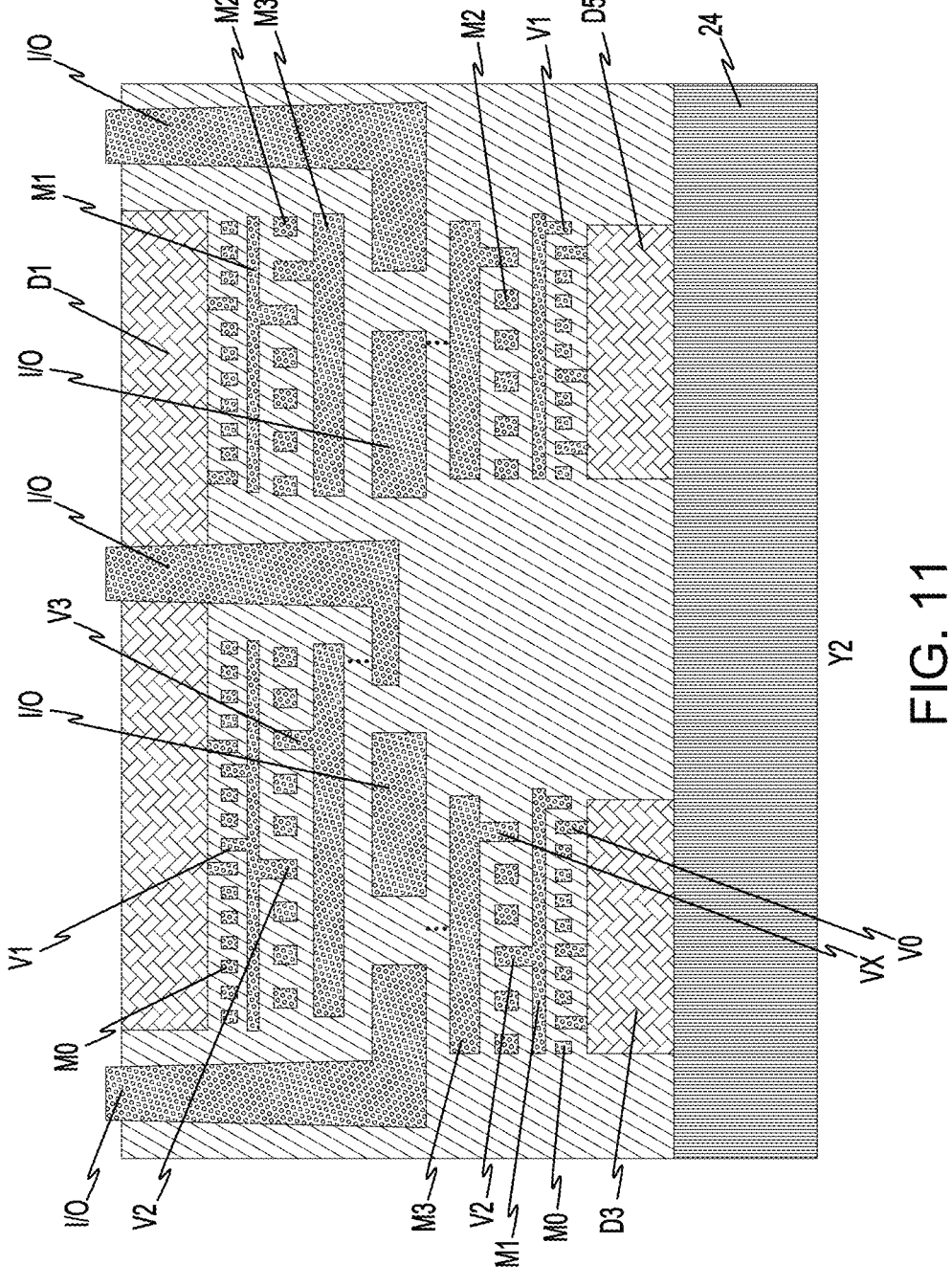

Referring now to FIGS. 8-11 illustrating a third intermediate stage of fabrication of the semiconductor structure 10, the first wafer substrate 16 of the logic wafer 12 is removed to the etch stop layer 18 by one or more of grinding and chemical-mechanical planarization (CMP). The etch stop layer 18 is thereafter removed via wet and/or dry etching processes. The remaining first wafer substrate 16 is removed via any suitable removal process to expose the device D1 of the logic wafer 12 (FIGS. 8 and 10) and expose the upper segments of the combined positive voltage (Vdd) contacts or lines, i.e., the combined (Vdd-1) and (Vdd-2) positive voltage lines, and the ground voltage (Vss) contacts or lines, i.e., the combined (Vss-1) and (Vss-2) ground voltage lines. FIGS. 9 and 11 illustrate the upper segments of the power lines including the positive voltage (Vdd) contacts or lines, the ground voltage (Vss) contacts or lines and the signal (I/O) contacts or lines (i.e., the combined (I/O-1) and (I/O-2) signal lines) exposed above the first device D1 and the logic wafer 12.

Figure 12:
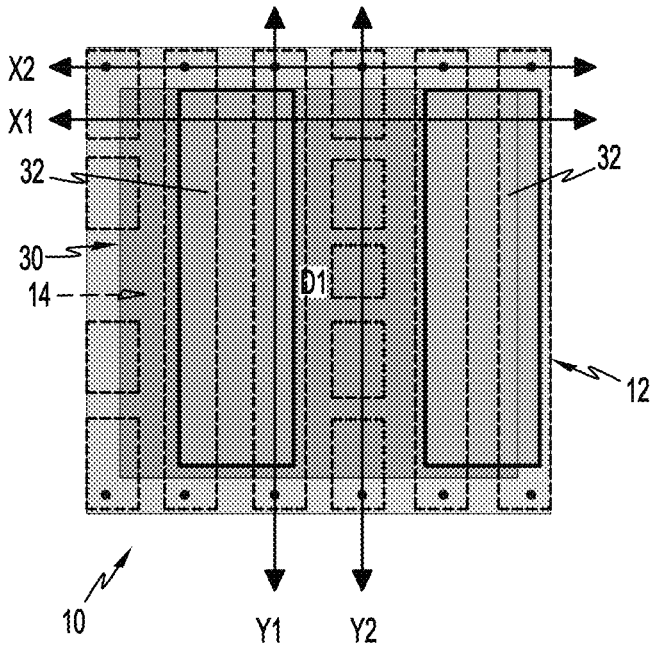
FIG. 12 is a schematic view similar to the view of FIG. 1B subsequent to formation of the backside power delivery network on the first wafer at a fourth intermediate stage of fabrication according to one or more illustrative embodiments.
Figure 13:
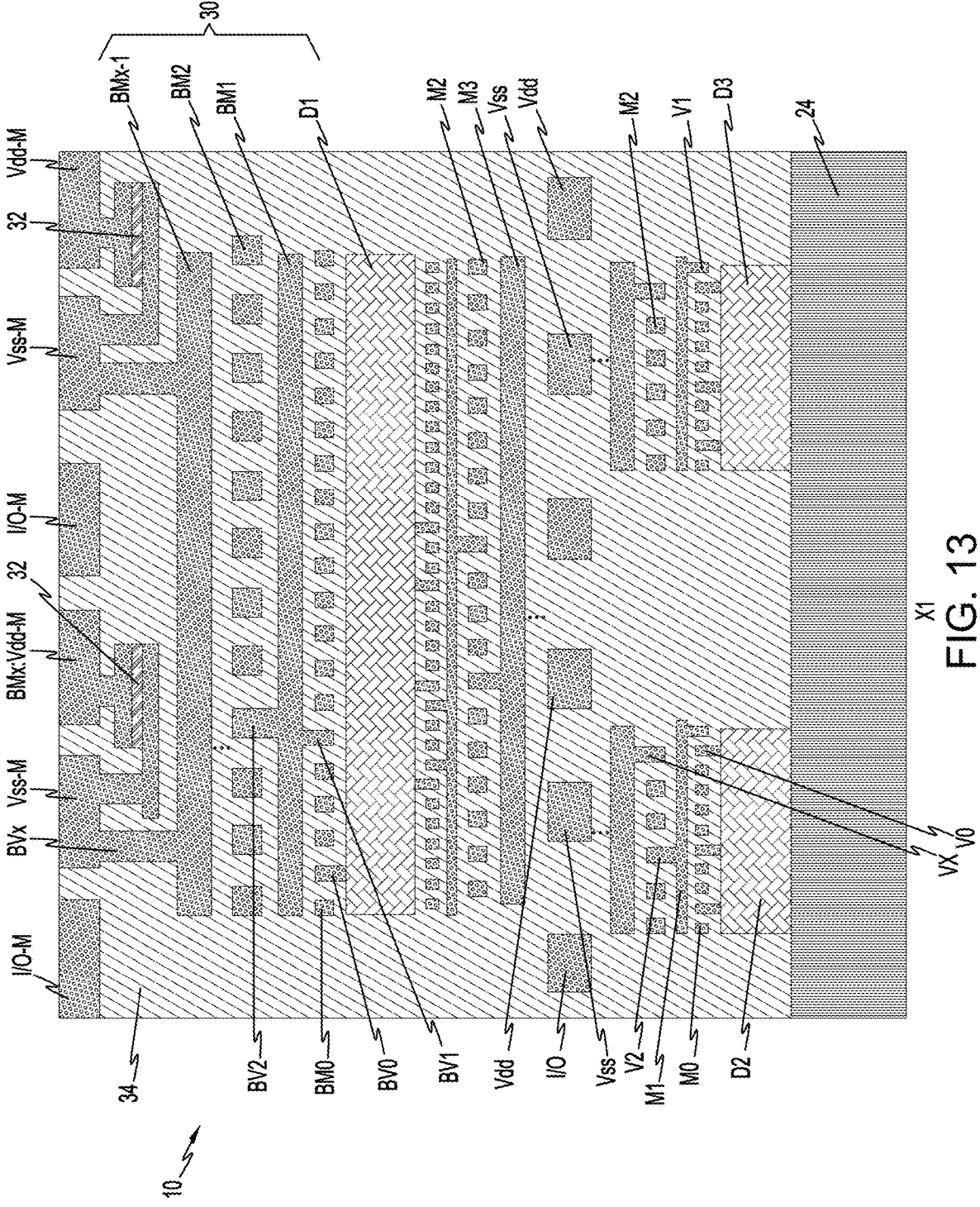
FIGS. 13-16 each are side elevation views in cross-section of the first and second wafers taken along the lines X1, X2, Y1 and Y2, respectively, of FIG. 12 at the fourth intermediate stage of fabrication according to one or more illustrative embodiments.

Referring now to FIGS. 12-15, a fourth intermediate stage of fabrication corresponding to backside processing of the semiconductor structure 10 is illustrated. FIG. 12 is a top plan view similar to the view of FIG. 1B subsequent to formation of a power distribution structure or, more specifically, a backside power delivery network (BSPDN) 30 on the logic wafer 12. As best depicted in the cross-sectional view of FIG. 13 taken along the line X1 of FIG. 12, in the fourth intermediate stage, the BSPDN 30 and a pair of decoupling capacitors 32 are formed on the backside of device D1 of the logic wafer 12. The BSPDN 30 also referred to as a power distribution network, in some embodiments, includes a plurality of conductive segments supported and electrically separated via an insulation layer 34 for power and signal transmission. In illustrative embodiments, the BSPDN 30 is a combination of conductive segments arranged in a grid or mesh structure including one or more power lines or contacts Vdd-M, Vss-M corresponding to the power lines Vdd and Vss, and one or more signal lines or contacts I/O-M corresponding to the signal lines I/O. The BSPDN 30 further provides metallization layers BM0, BM1, BM2, BMx-1 to BMx and power and signal routing paths or via structures BV0, BV1, BV2 to BVx. The BSPDN 30 may be fabricated utilizing known lithographic, etch, deposition, CMP and metallization processes.

Also depicted are the pair of decoupling capacitors 32 including first and second decoupling capacitors 32 which are shared between the first die having device D1 of the logic wafer 12 and the second dies having devices D2-D5 of the carrier wafer 14. The decoupling capacitors 32 may be coupled to the device D1 of the logic wafer 12 and at least two of the devices D2-D5 of the carrier wafer 14. More specifically, the first and second decoupling capacitors 32 are shared between the power lines, specifically the positive (Vdd-M) and ground (Vss-M) power leads or lines of the BSPDN 30. As best depicted in FIG. 12, in conjunction with FIG. 1C) a first of the decoupling capacitors 32 extends across the first device D1 of the logic wafer 12 and traverses the second and fourth devices D2, D4 of the carrier wafer 14 along the y-direction. A second of the decoupling capacitors 32 extends across the first device D1 of the logic wafer 12 and traverses the third and fifth devices D3, D5 of the carrier wafer 14 along the y-direction.

Each decoupling capacitor 32 is, in illustrative embodiments, a high-k metal-insulator-metal (MIM) capacitor, integrated into the insulation layer 34. The decoupling capacitors 32 provide a large decoupling capacitance in a small area, and have minimal impact on circuit density. The power stored within the decoupling capacitors 32 is shared between the first die having device D1 and the second dies having devices D2-D5 through the combination of the bonded cascade of power and signal lines and vias, for example, including positive power lines or contacts Vdd-M, Vdd and ground power lines Vss-M and Vss. This bonded structure provides relatively high value decoupling capacitors between positive power supply nodes, while providing low capacitance between interconnect lines that are used to carry signals.

Figure 14:
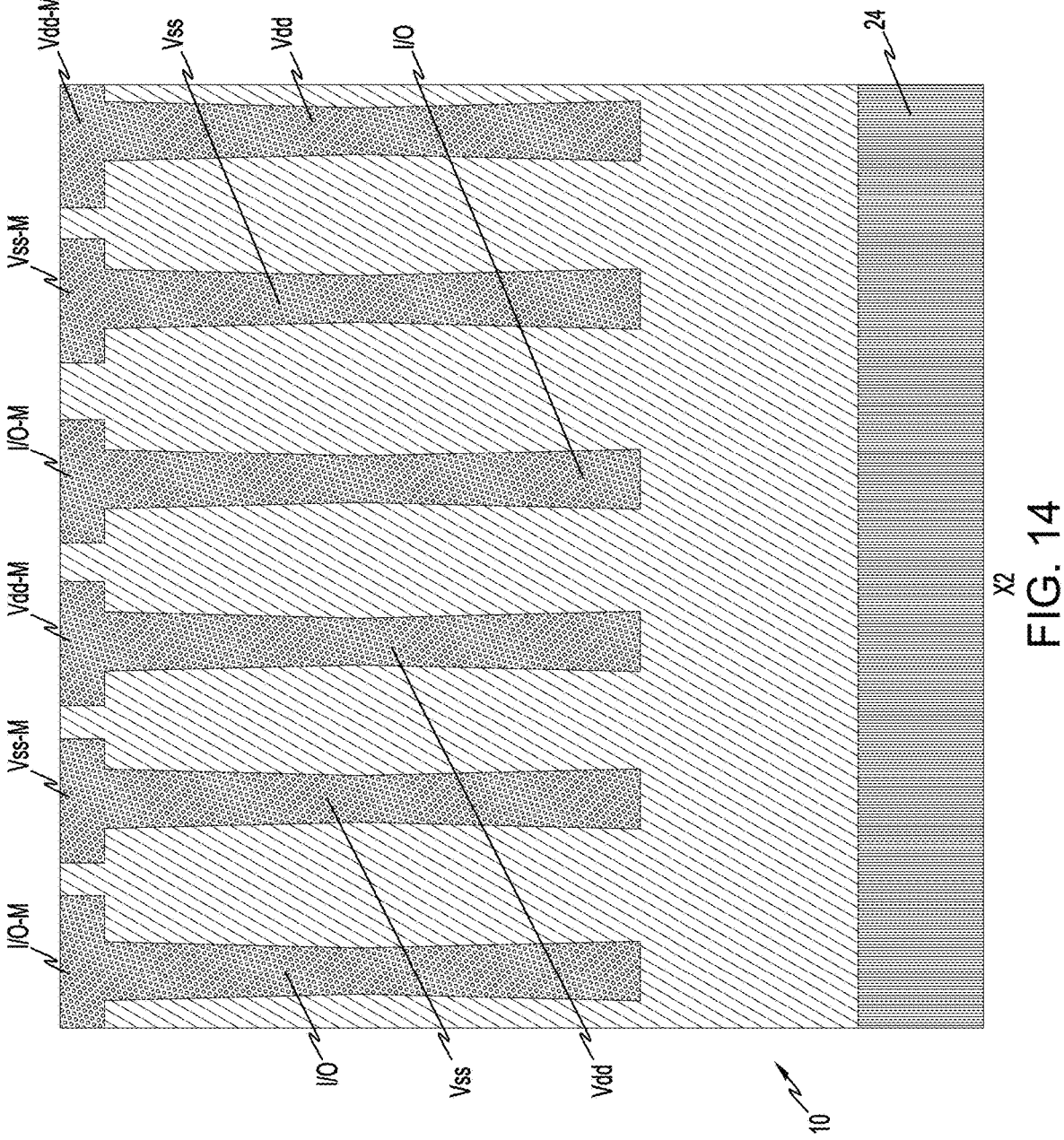

FIG. 14 is a cross-sectional view taken along the line X2 further representing the fourth intermediate stage. This view illustrates the cascade of power and signal lines formed through the BSPDN 30, in communication with the positive voltage (Vdd) contacts or via, the ground voltage (Vss) contacts or vias and the signal I/O contacts or vias of the devices D1-D5 of the first and second wafers 12, 14. This wiring architecture forms a cascade of power and signal lines through the semiconductor structure 10 to share power and signals between the BSPDN 30, the device D1 of the logic wafer 12 and the devices D2 to D5 of the carrier wafer 14.

Figure 15:
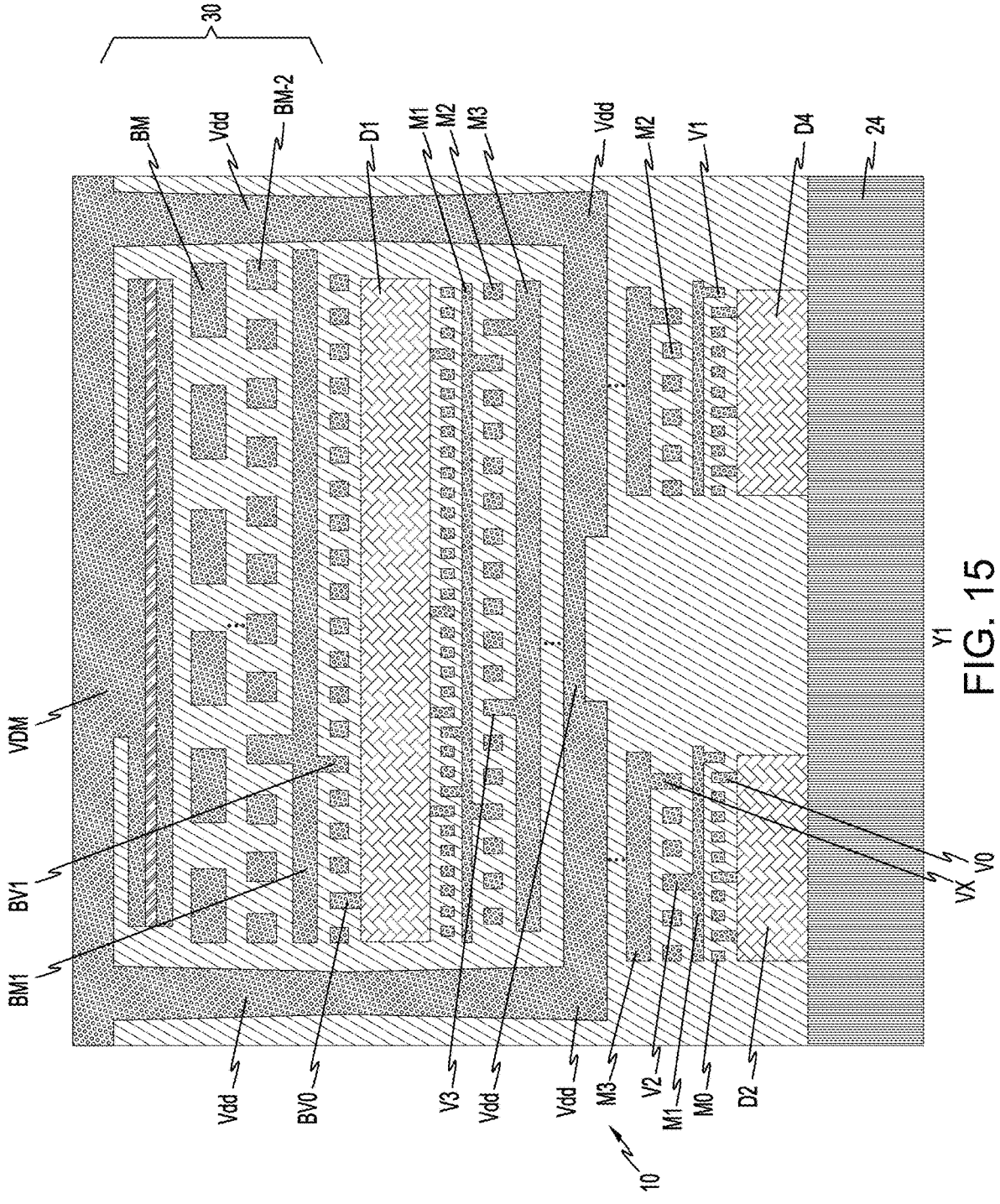

FIG. 15 is a cross-sectional view taken along the line Y1 representing the fourth intermediate stage and transfer of power through the semiconductor structure 10. This view depicts the connection of the combined (Vdd) power lines of die having device D1 of the logic wafer 12 and dies having devices D2, D4 of the carrier wafer 14 via the Vdd power plate. Furthermore, the power lines (Vdd) coupling the first die having device D1 of the logic wafer 12 and the second dies having devices D2, D4 are in parallel or share the decoupling capacitor 32. Thus, power is shared between the first device D1 and the second and fourth device D2, D4 through the decoupling capacitor 32. A similar arrangement is provided through the second decoupling capacitor 32 and device D1 of the logic wafer 12 and devices D3, D5 of the carrier wafer 14.

Figure 16:
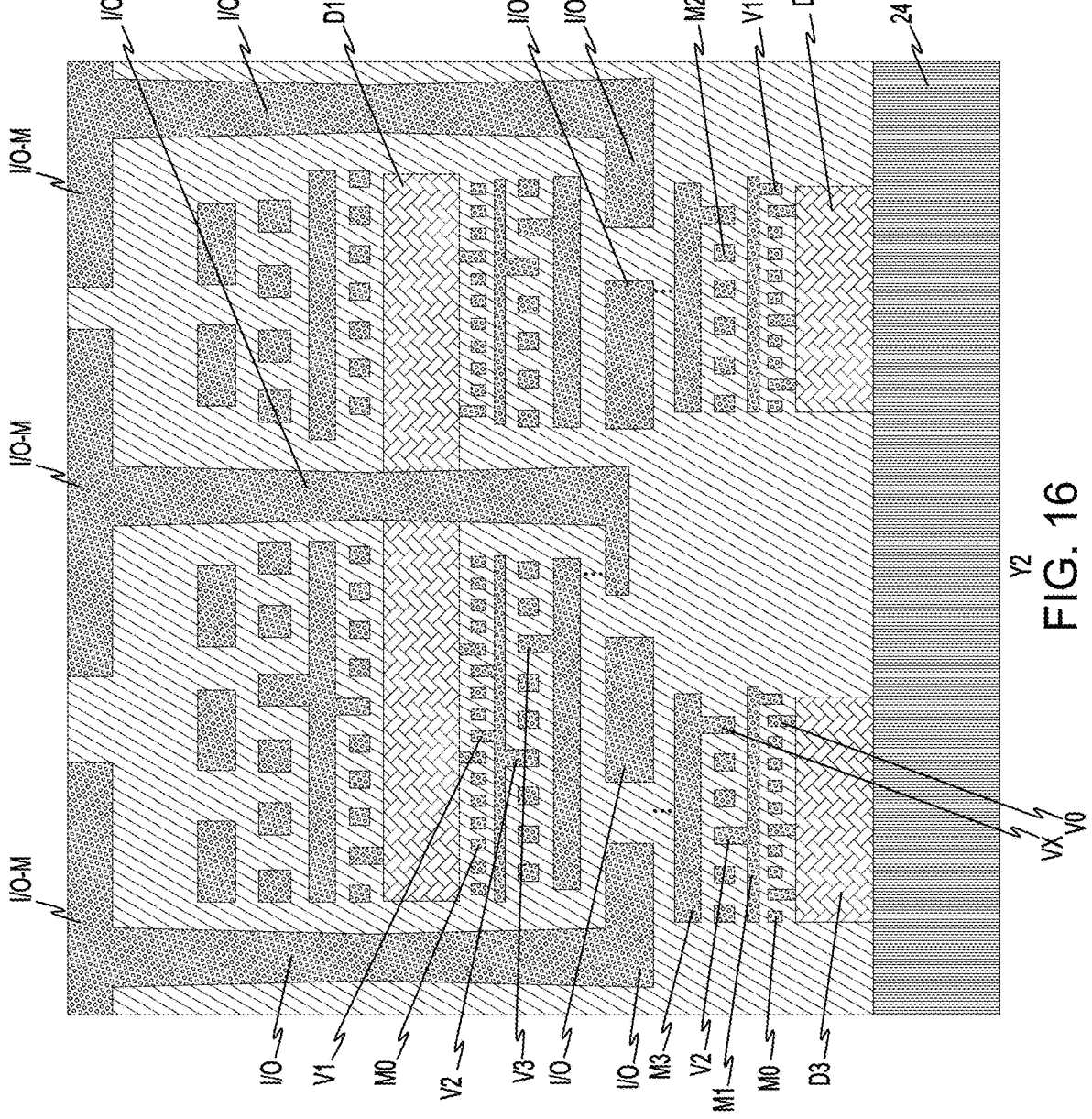

FIG. 16 is a cross-sectional view taken along the line Y2 representing the fourth intermediate stage illustrating transmission of signals through the signal lines of the semiconductor structure 10. The outer signal lines I/O share signals between the first die having device D1 of the logic wafer 12 and the second dies having devices D3, D5 of the carrier wafer 14. In illustrative embodiments, the middle signal transfer line I/O delivers signals solely to device D1 of the logic wafer 12 and is not connected to devices D3, D5 of the carrier wafer 14. The middle signal transfer line I/O can be formed anywhere within device D1 but isolated from the other components within the semiconductor structure 10. A similar arrangement is provided through the second decoupling capacitor 32 and device D1 of the logic wafer 12 and devices D2, D4 of the carrier wafer 14.

Thus, the flexible wiring structure described herein provides a cascade of power and signal lines, for example, vias, to enable transmission of power and signals between multiple devices of multiple stacked wafers of a semiconductor structure. In addition, the flexible wiring structure also enables the sharing of power in parallel between the devices D1 and D2-D5 via the one or more decoupling capacitors of multiple wafers to enhance performance, minimize scaling concerns and improving the overall performance of the semiconductor structure.

It is to be understood that the methods discussed herein for fabricating semiconductor devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing the disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the disclosure provided herein, one of ordinary skill in the art will be able to contemplate other implementations and applications of the techniques of the disclosure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

What is claimed is:

1. A semiconductor structure, comprising:
a power distribution structure disposed on a first wafer;
an interconnect structure disposed on the first wafer and a second wafer; and
at least one decoupling capacitor connected between the power distribution structure and the interconnect structure;
wherein the first wafer comprises a first die with a first device and a first portion of the interconnect structure;
wherein the second wafer comprises at least a second die with a second device and a second portion of the interconnect structure; and
wherein the decoupling capacitor is coupled to the first device of the first die via the first portion of the interconnect structure and to the second device of the second die via the second portion of the interconnect structure.

2. The semiconductor structure according to claim 1 wherein the first portion of the interconnect structure of the first wafer is coupled to the second portion of the interconnect structure of the second wafer.

3. The semiconductor structure according to claim 1 wherein the first portion of the interconnect structure of the first wafer is bonded to the second portion of the interconnect structure of the second wafer via a copper-to-copper bond.

4. The semiconductor structure according to claim 1 wherein the first device comprises a logic device.

5. The semiconductor structure according to claim 4 wherein the second device comprise a memory device.

6. The semiconductor structure according to claim 1 wherein the second wafer includes a plurality of the second dies, each of the second dies having a second device associated therewith.

7. The semiconductor structure according to claim 6 wherein the at least one decoupling capacitor is coupled to the first device of the first wafer and to at least two of the second devices of at least two of the second dies of the second wafer.

8. The semiconductor structure according to claim 6 wherein the at least one decoupling capacitor comprises first and second decoupling capacitors, the first decoupling capacitor being connected to the first device of the first wafer and at least one of the second devices of the second wafer, the second decoupling capacitor being connected to the first device of the first wafer and at least one other one of the second devices of the second wafer.

9. The semiconductor structure according to claim 1 further comprising at least one power line coupling the power distribution structure with the first device of the first wafer and the second device of the second wafer.

10. The semiconductor structure according to claim 9 further comprising at least one signal line coupling the power distribution structure with the first device of the first wafer and the at least a second device of the second wafer.

11. The semiconductor structure according to claim 10 further comprising at least one additional signal line coupling the power distribution structure with the first device of the first wafer.

12. The semiconductor structure according to claim 1 wherein the at least one decoupling capacitor comprises a metal-insulator-metal (MIM) capacitor.

13. A semiconductor structure, comprising:

a first wafer comprising a first device and a first back end of line structure;

a second wafer comprising a second device and a second back end of line structure, the second back end of line structure of the second wafer being coupled to the first back end of line structure of the first wafer;

one or more power lines at least partially extending within the first wafer and the second wafer;

a power distribution structure; and a decoupling capacitor disposed within the power distribution structure, the decoupling capacitor coupling the one or more power lines with the first device of the first wafer and the second device of the second wafer.

14. The semiconductor structure according to claim 13 further comprising one or more signal lines at least partially extending between the first wafer and the second wafer.

15. The semiconductor structure according to claim 14 wherein at least one of the one or more signal lines couples the power distribution structure with the first device of the first wafer.

16. The semiconductor structure according to claim 15 wherein said at least one of the one or more signal lines extends through the first device of the first wafer.

17. A semiconductor structure, comprising:

a first wafer comprising a first die with a logic device and a first back end of line structure;

a second wafer comprising a plurality of second dies, each second die having a memory device and a second back end of line structure, the second wafer and the first wafer being coupled to each other through bonding of one or more power lines and one or more signal lines of the first and second back end of line structures; and a power distribution structure disposed on the first wafer, the power distribution structure comprising at least one decoupling capacitor coupled to the logic device of the first wafer and at least two of the memory devices of the second wafer.

18. The semiconductor structure according to claim 17 wherein the one or more power lines and the one or more signal lines of the first and second back end of line structures are bonded via a copper-to-copper bond.

19. The semiconductor structure according to claim 17 wherein the at least one decoupling capacitor comprises first and second decoupling capacitors, the first decoupling capacitor being connected to the logic device of the first wafer and at least one of the memory devices of the second wafer, the second decoupling capacitor being connected to the logic device of the first wafer and at least one other one of the memory devices of the second wafer.

20. The semiconductor structure according to claim 17 wherein the at least one decoupling capacitor comprises a metal-insulator-metal (MIM) capacitor.

* * * * *